United States Patent
Nakamura

(10) Patent No.: US 12,464,664 B2
(45) Date of Patent: Nov. 4, 2025

(54) ELECTRIC APPARATUS AND ELECTRIC DEVICE

(71) Applicant: TOSHIBA MITSUBISHI-ELECTRIC INDUSTRIAL SYSTEMS CORPORATION, Tokyo (JP)

(72) Inventor: Koki Nakamura, Chuo-ku (JP)

(73) Assignee: TMEIC Corporation, Tokyo (JP)

( * ) Notice: Subject to any disclaimer, the term of this patent is extended or adjusted under 35 U.S.C. 154(b) by 0 days.

(21) Appl. No.: 18/576,710

(22) PCT Filed: May 24, 2022

(86) PCT No.: PCT/JP2022/021258
§ 371 (c)(1),
(2) Date: Jan. 4, 2024

(87) PCT Pub. No.: WO2023/228278
PCT Pub. Date: Nov. 30, 2023

(65) Prior Publication Data
US 2024/0251514 A1 Jul. 25, 2024

(51) Int. Cl.
*H05K 5/02* (2006.01)
*H05K 7/18* (2006.01)
*H05K 7/14* (2006.01)

(52) U.S. Cl.
CPC .......... *H05K 5/0221* (2013.01); *H05K 7/183* (2013.01); *H05K 7/1425* (2013.01)

(58) Field of Classification Search
None
See application file for complete search history.

(56) References Cited

U.S. PATENT DOCUMENTS 10,563,429 B1 * 2/2020 Bailey ................ E05B 35/008
2006/0290245 A1 12/2006 Hidaka
(Continued)

FOREIGN PATENT DOCUMENTS

JP 60-58041 U 4/1985
JP 2001-94279 A 4/2001
(Continued)

OTHER PUBLICATIONS

Written Opinion of the International Searching Authority issued Aug. 23, 2022 in PCT/JP2022/021258, (with English translation), 7 pages.

(Continued)

*Primary Examiner* — Xanthia C Relford
(74) *Attorney, Agent, or Firm* — Oblon, McClelland, Maier & Neustadt, L.L.P.

(57) ABSTRACT

A rack includes first to fourth column members and first and second guide members. A case of an electric device has first and second side surfaces in a width direction that are supported by the first and second guide members, respectively. First and second restriction members are attached to inner surfaces of the first and second side surfaces of the case, respectively, for restricting the case from moving in a front direction of the rack. Second restriction member is attached to face the first restriction member in the width direction. In a state where the electric device is housed within the rack, the first restriction member is located between the first and third column members in a front-back direction. The second restriction member is located between the second and fourth column members in the front-back direction.

13 Claims, 8 Drawing Sheets

(56) References Cited

U.S. PATENT DOCUMENTS

2014/0177164 A1* 6/2014 Stewart ............. H05K 13/0486
211/26
2015/0181753 A1 6/2015 Murakami

FOREIGN PATENT DOCUMENTS

| JP | 2009-218326 A | 9/2009 |
| JP | 2014-216350 A | 11/2014 |
| KR | 10-2006-0135466 A | 12/2006 |

OTHER PUBLICATIONS

Office Action issued Dec. 9, 2024, in corresponding Korean Patent Application No. 10-2023-7043393 (with English Translation), 18 pages.
International Search Report Issued Aug. 23, 2022, in PCT/JP2022/021258, filed on May 24, 2022, 2 pages.
Japanese Office Action issued Jun. 6, 2023, in Japanese Patent Application No. 2022-566173, 8 pages (with English Translation).

* cited by examiner

ELECTRIC APPARATUS AND ELECTRIC DEVICE

TECHNICAL FIELD

The present disclosure relates to an electric apparatus and an electric device.

BACKGROUND ART

Japanese Patent Laying-Open No. 2009-218326 (PTL 1) discloses a structure for mounting an electronic device unit in a rack. Side adapters are attached to both side surfaces of the electronic device unit. Rack fixtures are attached to the rack. The electronic device unit is mounted in the rack fixtures via the side adapters. When the electronic device unit is pulled out, the electronic device unit is prevented from falling, as stop portions provided in the side adapters engage falling prevention members provided in the rack fixtures.

Japanese Patent Laying-Open No. 2014-216350 (PTL 2) discloses a casing unit storage rack. A rack body has a shelf board on which a casing unit is placed. An engaging member protruding upward is attached to a front end portion of the shelf board. An engaged member protruding from a bottom surface of the casing unit is attached to a back end portion of the casing unit. When the casing unit is pulled out forward from the rack body, the casing unit is prevented from falling, as the engaging member engages the engaged member.

CITATION LIST

Patent Literature

PTL 1: Japanese Patent Laying-Open No. 2009-218326
PTL 2: Japanese Patent Laying-Open No. 2014-216350

SUMMARY OF INVENTION

Technical Problem

Both of the rack mount structures disclosed in PTL 1 and PTL 2 adopt a configuration of attaching the engaging member to the rack and attaching the engaged member to an outer surface of the unit. According to this configuration, when the unit is pulled out from the rack, the unit can be prevented from falling out of the rack by engagement between the engaging member and the engaged member.

On the other hand, however, in the configuration described above, there are concerns that the rack and the unit may each have a large size, and that they may each have a complicated shape. Increases in the sizes of the rack and the unit lead to increases in the size and weight of the entire apparatus. There is a concern that complicated shapes of the rack and the unit lead to an increase in the cost for processing and assembling the rack and the unit.

Further, since a work of releasing engagement is required to completely pull out the unit from the rack, there is a concern that time and efforts are required for a work of pulling out and inserting the unit, which reduces workability.

The present disclosure has been made to solve such a problem, and an object of the present disclosure is to provide an electric apparatus and an electric device capable of preventing the electric device from falling out of a rack without enlarging and complicating the electric apparatus.

Solution to Problem

An electric apparatus in accordance with an aspect of the present disclosure includes a rack having a rectangular parallelepiped shape, and an electric device housed within the rack to be able to be pulled out and inserted from a front of the rack. The rack includes first to fourth column members, and first and second guide members. The first and second column members are arranged to be spaced from each other in a width direction of the rack, and each extend in a vertical direction. The third and fourth column members are arranged to be spaced from the first and second column members, respectively, in a back direction of the rack, and each extend in the vertical direction. The first guide member is arranged between the first and third column members, and extends in a front-back direction of the rack. The second guide member is arranged between the second and fourth column members to face the first guide member in the width direction, and extends in the front-back direction. The electric device includes a case, and first and second restriction members. The case has a rectangular parallelepiped shape, and has first and second side surfaces in the width direction that are supported by the first and second guide members, respectively. The first restriction member is attached to an inner surface of the first side surface, for restricting the case from moving in a front direction of the rack. The second restriction member is attached to an inner surface of the second side surface to face the first restriction member in the width direction. The second restriction member restricts the case from moving in the front direction of the rack. In a state where the electric device is housed within the rack, the first restriction member is located between the first and third column members in the front-back direction. The second restriction member is located between the second and fourth column members in the front-back direction.

Advantageous Effects of Invention

According to the present disclosure, it is possible to provide an electric apparatus and an electric device capable of preventing the electric device from falling out of a rack without enlarging and complicating the electric apparatus.

DESCRIPTION OF EMBODIMENTS

Figure 1:
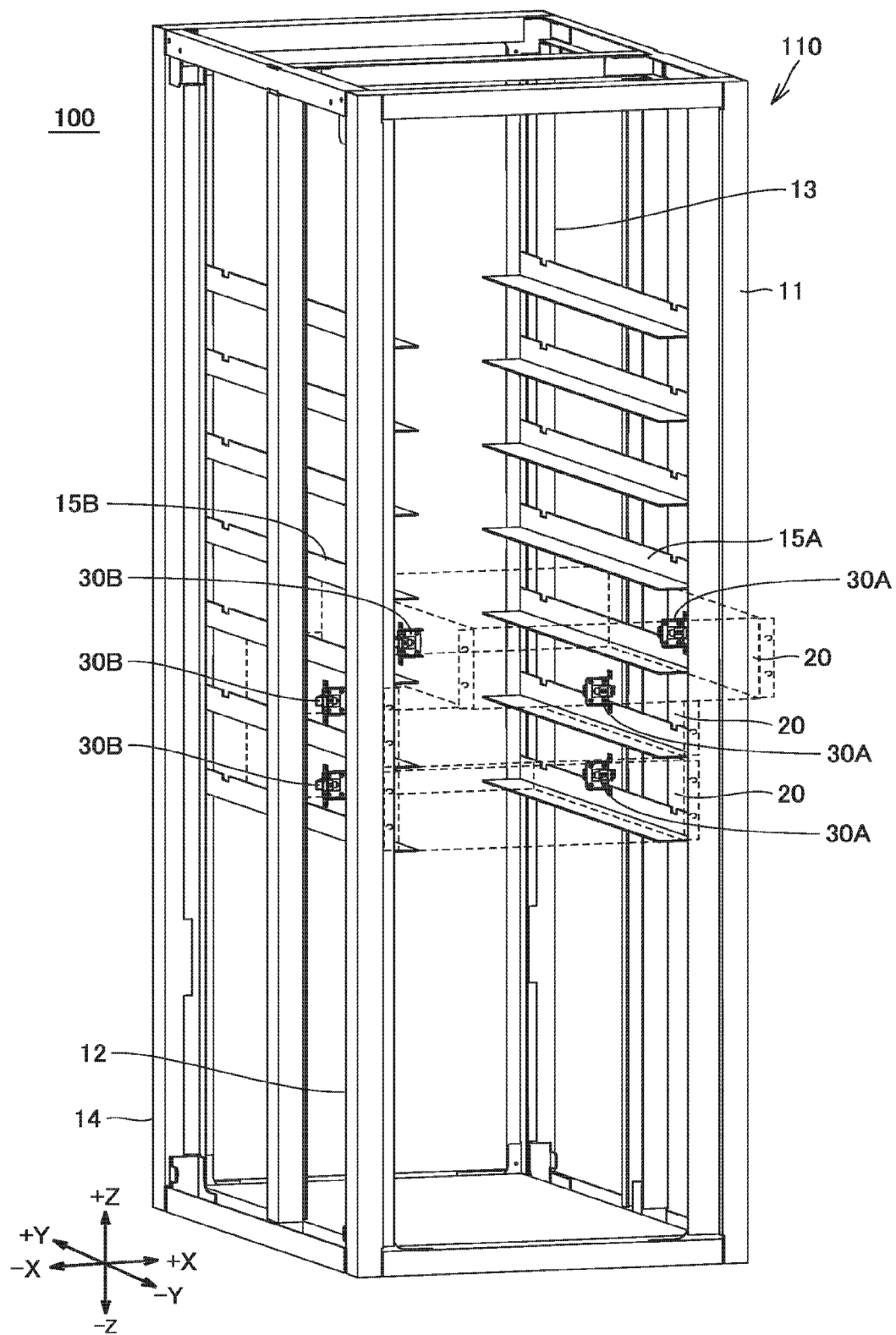
FIG. 1 is a schematic external view showing an example of a configuration of an electric apparatus in accordance with an embodiment.

Hereinafter, an embodiment of the present disclosure will be described in detail with reference to the drawings. It should be noted that, in the following, identical or corresponding parts in the drawings will be designated by the same reference numerals, and the description thereof will not be repeated in principle.

(Example of Configuration of Electric Apparatus)

FIG. 1 is a schematic external view showing an example of a configuration of an electric apparatus in accordance with an embodiment. In the following, an uninterruptible power supply apparatus will be described as an example of an electric apparatus based on the concept of the present disclosure. However, the electric apparatus in accordance with the present disclosure is not limited to an uninterruptible power supply apparatus, and may be any electric apparatus having a configuration of housing any electric device within a rack.

FIG. 1 shows a state where plate-shaped members constituting outer surfaces of a casing of an electric apparatus 100 are removed so that the inside of the casing is visible. As shown in FIG. 1, electric apparatus 100 includes a rack 110. A plurality of electric devices 20 constituting an uninterruptible power supply apparatus are housed within rack 110.

In the following description, a left-right direction (width direction) of rack 110 and electric devices 20 when electric apparatus 100 is viewed from a front surface side is defined as an X-axis direction, a front-back direction (depth direction) of rack 110 and electric devices 20 is defined as a Y-axis direction, and a vertical direction (height direction) of rack 110 and electric devices 20 is defined as a Z-axis direction. It should be noted that a +X direction is a direction extending rightward in the X-axis direction, and a −X direction is a direction opposite to the +X direction. A +Y direction is a direction extending from a front surface to a back surface of rack 110, and a −Y direction is a direction opposite to the +Y direction. A +Z direction is a direction extending upward in the Z-axis direction, and a −Z direction is a direction opposite to the +Z direction.

Rack 110 has a rectangular parallelepiped external shape. Rack 110 has a plurality of frame members for supporting the casing. The plurality of frame members include first to fourth column members 11 to 14 extending in the Z-axis direction. First and second column members 11 and 12 are arranged to be spaced from each other in the X-axis direction. Third column member 13 is arranged to be spaced from first column member 11 in the +Y direction. Fourth column member 14 is arranged to be spaced from second column member 12 in the +Y direction.

Rack 110 has a plurality of first guide members 15A and a plurality of second guide members 15B. Each of the plurality of first guide members 15A is arranged between first column member 11 and third column member 13, and extends in the Y-axis direction. The plurality of first guide members 15A are arranged to be spaced from each other in the Z-axis direction.

Each of the plurality of second guide members 15B is arranged between second column member 12 and fourth column member 14, and extends in the Y-axis direction. The plurality of second guide members 15B are arranged to be spaced from each other in the Z-axis direction. The plurality of first guide members 15A and the plurality of second guide members 15B are arranged at positions where they face each other in the X-axis direction. A pair of guide members 15A and 15B located to face each other in the X-axis direction has a function as a support member for supporting electric device 20 from below.

It should be noted that the support member may be a shelf board formed in a flat plate shape along the X-axis direction and the Y-axis direction. In this case, electric device 20 is placed on an upper surface of the shelf board.

The plurality of electric devices 20 each have a rectangular parallelepiped external shape, and are housed within rack 110 to be stacked with a spacing therebetween in the Z-axis direction. Although the plurality of electric devices 20 have the same shape and size in the example in FIG. 1, the plurality of electric devices 20 may have different shapes and/or sizes.

The plurality of electric devices 20 include a plurality of uninterruptible power supply (UPS) units, and at least one bypass unit. The plurality of UPS units and the at least one bypass unit are electrically connected in parallel between an input terminal and an output terminal not shown. An alternating current power supply is connected to the input terminal, and a load is connected to the output terminal.

The UPS unit is configured to house, inside a case having a rectangular parallelepiped shape, a plurality of electrical components including power converters such as a converter, an inverter, and a bidirectional chopper, a capacitor, and a reactor. The bypass unit is configured to house, inside a case having a rectangular parallelepiped shape, a plurality of electrical components including a bypass switch.

Rack 110 is configured such that each electric device 20 can be pulled out and inserted from a front of rack 110, to facilitate performing maintenance check on each electric device 20 or replacing it with a new device while electric apparatus 100 is in service. FIG. 1 shows a state where one electric device 20 is pulled out from rack 110.

As shown in FIG. 1, electric device 20 is pulled out by an operator in a front direction (the −Y direction) of rack 110, with a bottom surface of the case being supported by a pair of guide members 15A and 15B. On this occasion, electric device 20 may fall out of rack 110 accidentally due to disrupted weight balance of electric device 20 in the Y-axis direction. Alternatively, electric device 20 may fall out of rack 110 as a result of the operator pulling out electric device 20 powerfully.

In order to prevent such falling of electric device 20, restriction members 30A and 30B for restricting forward movement of electric device 20 are provided inside each electric device 20. Restriction members 30A and 30B are respectively attached to inner surfaces of two side surfaces of electric device 20 in the X-axis direction. First restriction member 30A and second restriction member 30B are arranged at positions where they face each other in the X-axis direction.

Restriction members 30A and 30B are configured to restrict forward movement of electric device 20 by causing portions thereof to abut on first and second column members 11 and 12, respectively, in a scene where electric device 20 is pulled out from the front of rack 110, as describe later.

(Configuration of Electric Device)

Figure 2:
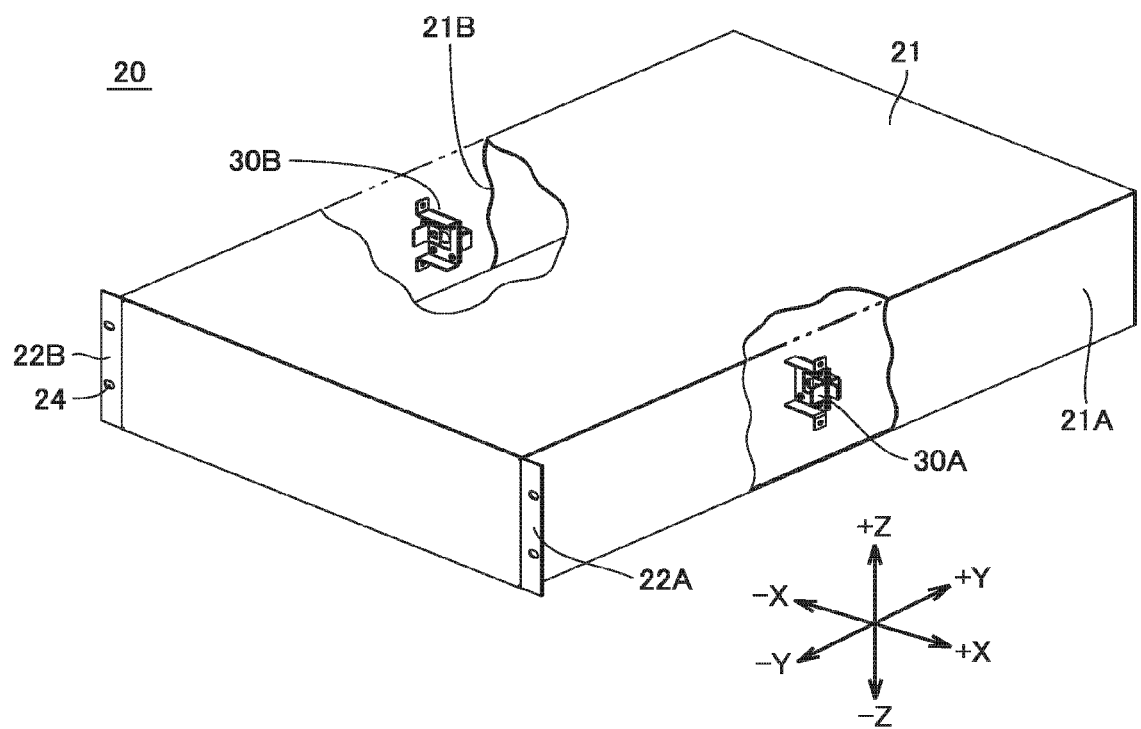
FIG. 2 is a perspective view showing a configuration of an electric device shown in FIG. 1.

FIG. 2 is a perspective view showing a configuration of electric device 20 shown in FIG. 1. FIG. 2 shows a state where portions of an inside of a case 21 of electric device 20 are visible.

As shown in FIG. 2, electric device 20 has case 21 having a rectangular parallelepiped external shape. A pair of fin portions 22A and 22B is provided at a front surface of case 21. Fin portion 22A has a flat plate shape, and protrudes in the +X direction from an end portion of the front surface of case 21 in the +X direction. Fin portion 22B has a flat plate shape, and protrudes in the −X direction from an end portion of the front surface of case 21 in the −X direction.

In each of fin portions 22A and 22B, a through hole 24 penetrating in a thickness direction is formed. Through hole 24 is used to fix electric device 20 to rack 110. Electric device 20 is fixed to rack 110 by fastening a pair of fin portions 22A and 22B to first and second column members 11 and 12, respectively, using fastening members represented by bolts, in a state where electric device 20 is housed in rack 110.

Case 21 has a first side surface 21A, and a second side surface 21B that faces first side surface 21A. First restriction member 30A is attached to the inner surface of first side surface 21A. Second restriction member 30B is attached to the inner surface of second side surface 21B. First restriction member 30A and second restriction member 30B are arranged at positions where they face each other in the X-axis direction.

As shown in FIG. 1, in the state where electric device 20 is housed in rack 110, first restriction member 30A is arranged between first column member 11 and third column member 13 in the Y-axis direction. Second restriction member 30B is arranged between second column member 12 and fourth column member 14 in the Y-axis direction.

With such a configuration, when electric device 20 is pulled out in front of rack 110, portions of restriction members 30A and 30B can be caused to abut on column members 11 and 12, respectively, while electric device 20 moves in the −Y direction. As restriction members 30A and 30B abut on column members 11 and 12, movement of electric device 20 in the −Y direction is restricted. As a result, electric device 20 can be held without dropping, in a state where a portion of electric device 20 is pulled out from rack 110, as shown in FIG. 1.

It should be noted that each of restriction members 30A and 30B has a mechanism for releasing abutment of restriction member 30A, 30B on column member 11, 12. Movement of electric device 20 in the −Y direction is permitted by releasing abutment between restriction member 30A, 30B and column member 11, 12 using this mechanism. Therefore, it is possible to move electric device 20 in the −Y direction and completely pull out electric device 20 from rack 110.

(Configuration of Restriction Members)

Next, a configuration of restriction members 30A and 30B will be described with reference to FIGS. 3 and 4.

Figure 3:
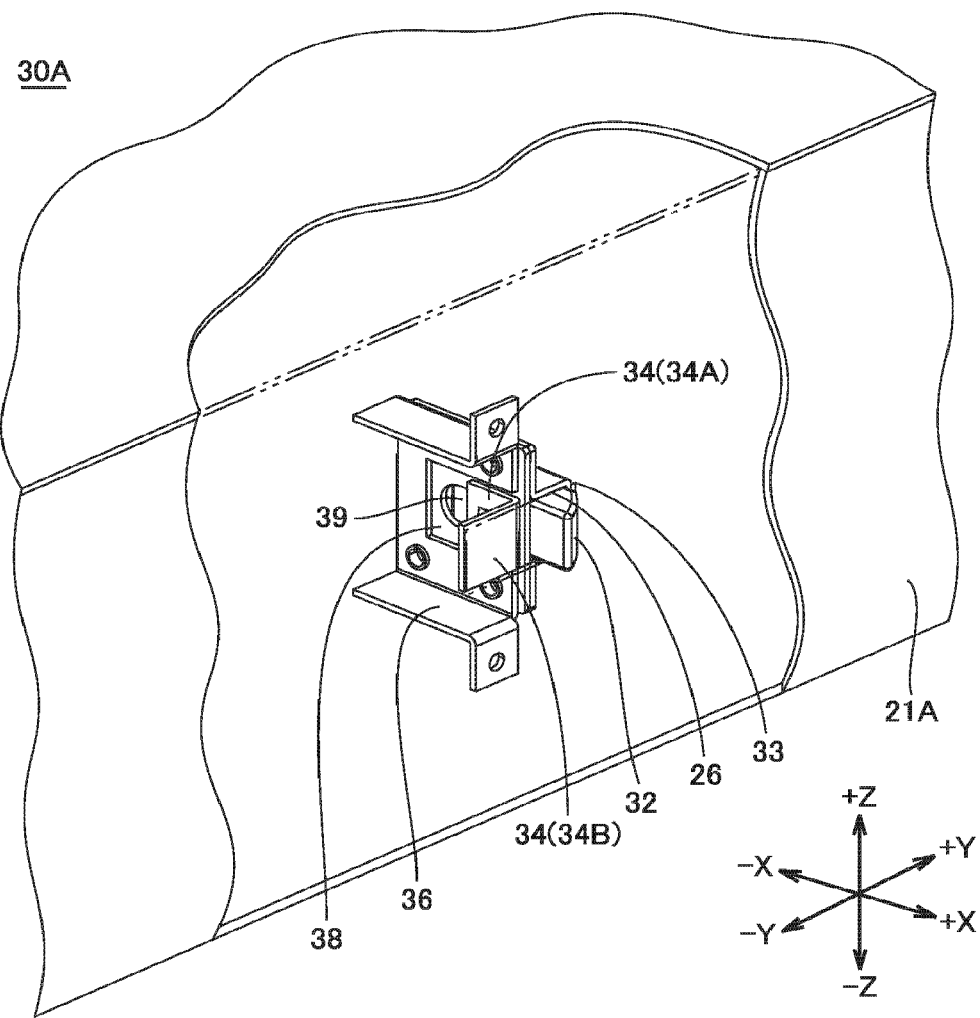
FIG. 3 is a perspective view showing a configuration of a first restriction member.

FIG. 3 is a perspective view showing a configuration of first restriction member 30A. FIG. 3 shows a portion of first side surface 21A of case 21 of electric device 20, in an enlarged view. Although FIGS. 3 and 4 illustrate details of the configuration of first restriction member 30A, second restriction member 30B also has the same configuration as that of first restriction member 30A.

As shown in FIG. 3, first restriction member 30A is configured to include a latch member 32, a cover member 33, a releasing member 34, a fixing member 36, a base member 38, and an elastic member (not shown).

Latch member 32 has a quadrangular prism shape. Latch member 32 is arranged in the inside of case 21 to extend in the X-axis direction. Latch member 32 is covered with cover member 33. The elastic member (not shown) for biasing latch member 32 toward a protruding state is provided inside cover member 33.

An opening 26 having a rectangular shape is formed in first side surface 21A of case 21. An end portion of latch member 32 in the +X direction protrudes from first side surface 21A in the +X direction through opening 26. A surface of the protruding portion of latch member 32 has a curved surface shape that is convex toward the +Y direction.

Releasing member 34 is arranged in front of latch member 32 in the inside of case 21. Releasing member 34 and latch member 32 are coupled. Releasing member 34 has a flat plate-shaped base portion 34A coupled to latch member 32, and a flat plate-shaped bent portion 34B. Base portion 34A is arranged in parallel with latch member 32. Bent portion 34B is provided at an end portion of base portion 34A in the +X direction.

Bent portion 34B extends in the Y-axis direction. Bent portion 34B is exposed from opening 26. Base portion 34A and bent portion 34B form a substantially right angle. Bent portion 34B is joined to the end portion of base portion 34A in the +X direction. Base portion 34A and bent portion 34B may be formed integrally by bending and deforming one sheet of plate material.

Base member 38 is provided between latch member 32 and releasing member 34. Cover member 33 is attached to base member 38. Base member 38 has a first surface that supports latch member 32, and a second surface that supports base portion 34A of releasing member 34. A through hole 39 penetrating the first and second surfaces is formed in base member 38. Through hole 39 has a shape extending in the X-axis direction.

Latch member 32 and base portion 34A of releasing member 34 are coupled inside through hole 39. Thereby, a coupled portion of latch member 32 and releasing member 34 can be moved in the X-axis direction in the inside of through hole 39.

Fixing member 36 is a member for fixing latch member 32, cover member 33, base member 38, and releasing member 34 to the inner surface of first side surface 21A. Base member 38 is attached to fixing member 36. Base member 38 is fixed to first side surface 21A via fixing member 36.

FIG. 3 shows a state where the coupled portion of latch member 32 and releasing member 34 is arranged at a position close to first side surface 21A in the inside of through hole 39. In this state, latch member 32 is in a state where its end portion in the +X direction protrudes from first side surface 21A in the +X direction through opening 26.

Here, a length of the portion of latch member 32 protruding from first side surface 21A is set such that the end portion of latch member 32 in the +X direction abuts on first column member 11 when electric device 20 is moved in the −Y direction. As the end portion of latch member 32 in the +X direction abuts on first column member 11, movement of electric device 20 in the −Y direction is restricted. Thereby, electric device 20 can be held without dropping, in a state where a portion of electric device 20 is pulled out from rack 110, as shown in FIG. 1.

Figure 4:
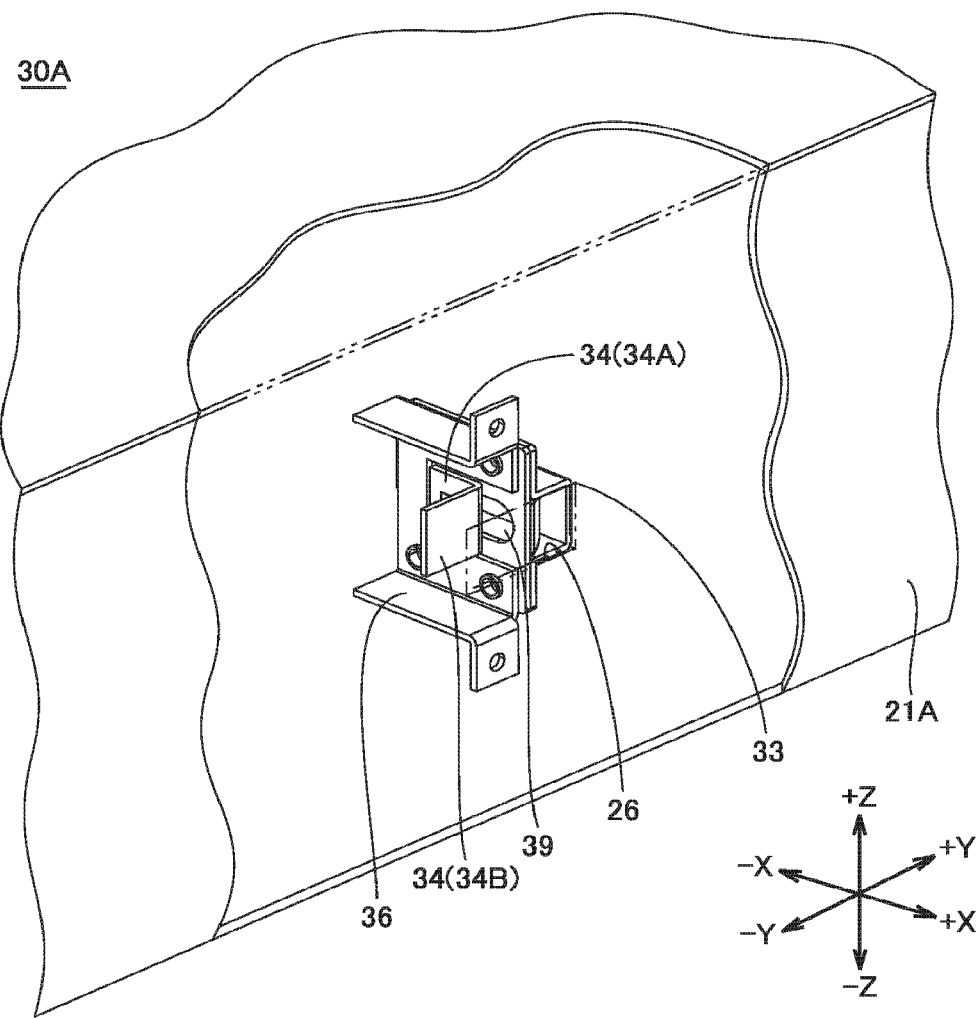
FIG. 4 is a perspective view showing a configuration of the first restriction member.

By moving the coupled portion of latch member 32 and releasing member 34 in the −X direction toward the inside of case 21 from the state shown in FIG. 3, the end portion of latch member 32 in the +X direction can completely enter the inside of case 21, as shown in FIG. 4.

FIG. 4 shows a state where latch member 32 completely enters the inside of case 21, in first restriction member 30A. As shown in FIG. 4, the operator can move the coupled portion of latch member 32 and releasing member 34 in the −X direction toward the inside of case 21, by pressing bent portion 34B of releasing member 34 exposed from opening 26 formed in first side surface 21A, toward the inside of case 21. As the coupled portion is moved, the end portion of latch member 32 in the +X direction completely enters the inside of case 21. As a result, abutment between the end portion of latch member 32 in the +X direction and first column member 11 is released, and movement of electric device 20 in the −Y direction is permitted.

As described above, second restriction member 30B has the same configuration as that of first restriction member 30A. Therefore, second restriction member 30B is configured such that an end portion of latch member 32 in the −X direction abuts on second column member 12 in a state where the end portion of latch member 32 in the −X direction protrudes in the −X direction from opening 26 formed in second side surface 21B (see FIG. 3). As latch member 32 abuts on second column member 12, movement of electric device 20 in the −Y direction is restricted.

Further, second restriction member 30B is configured such that abutment between the end portion of latch member 32 in the −X direction and second column member 12 is released in a state where the end portion of latch member 32 in the −X direction completely enters the inside of case 21 (see FIG. 4). Thereby, movement of electric device 20 in the −Y direction is permitted.

(Method of Pulling Out Electric Device)

Next, a method of pulling out electric device 20 from rack 110 will be illustrated with reference to FIGS. 5 to 7. The method illustrated below is carried out in a scene where maintenance check is performed on electric device 20, or a scene where electric device 20 is replaced with a new device.

Figure 5:
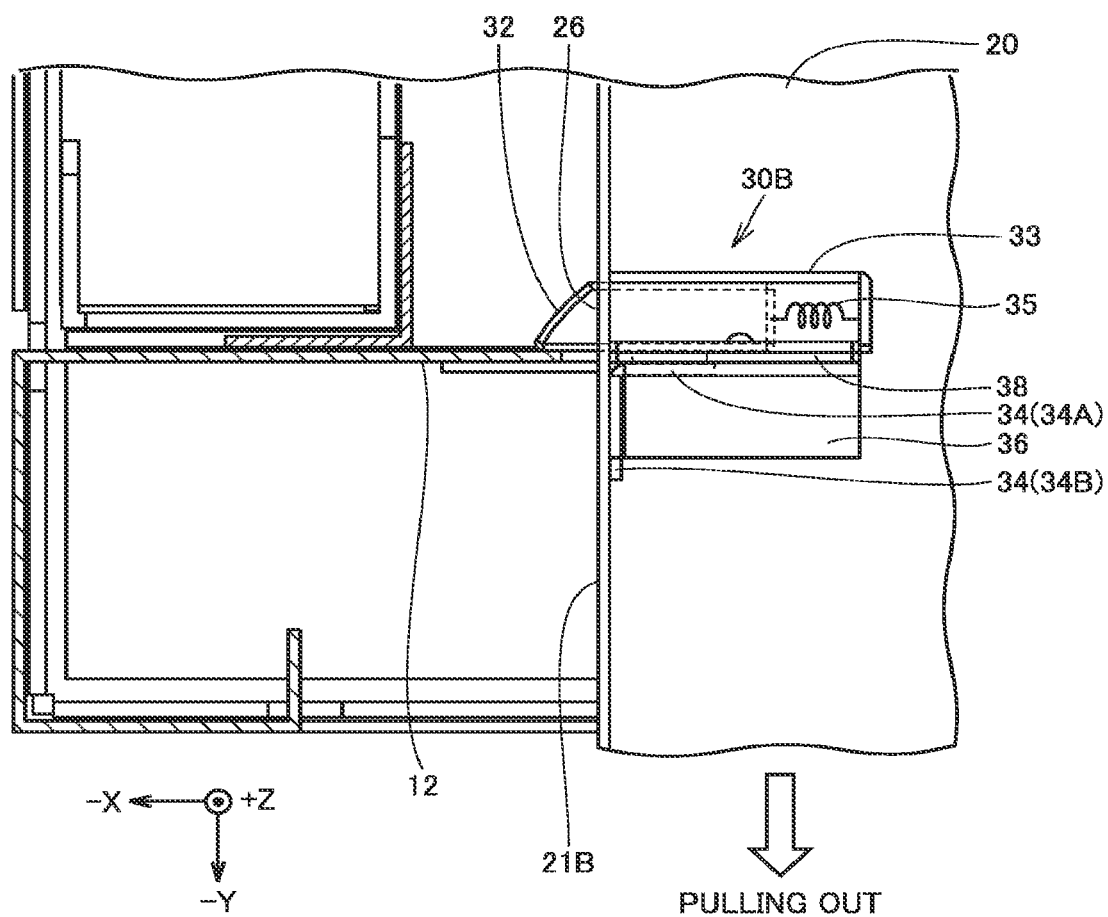
FIG. 5 is a view illustrating a method of pulling out the electric device from a rack.
Figure 6:
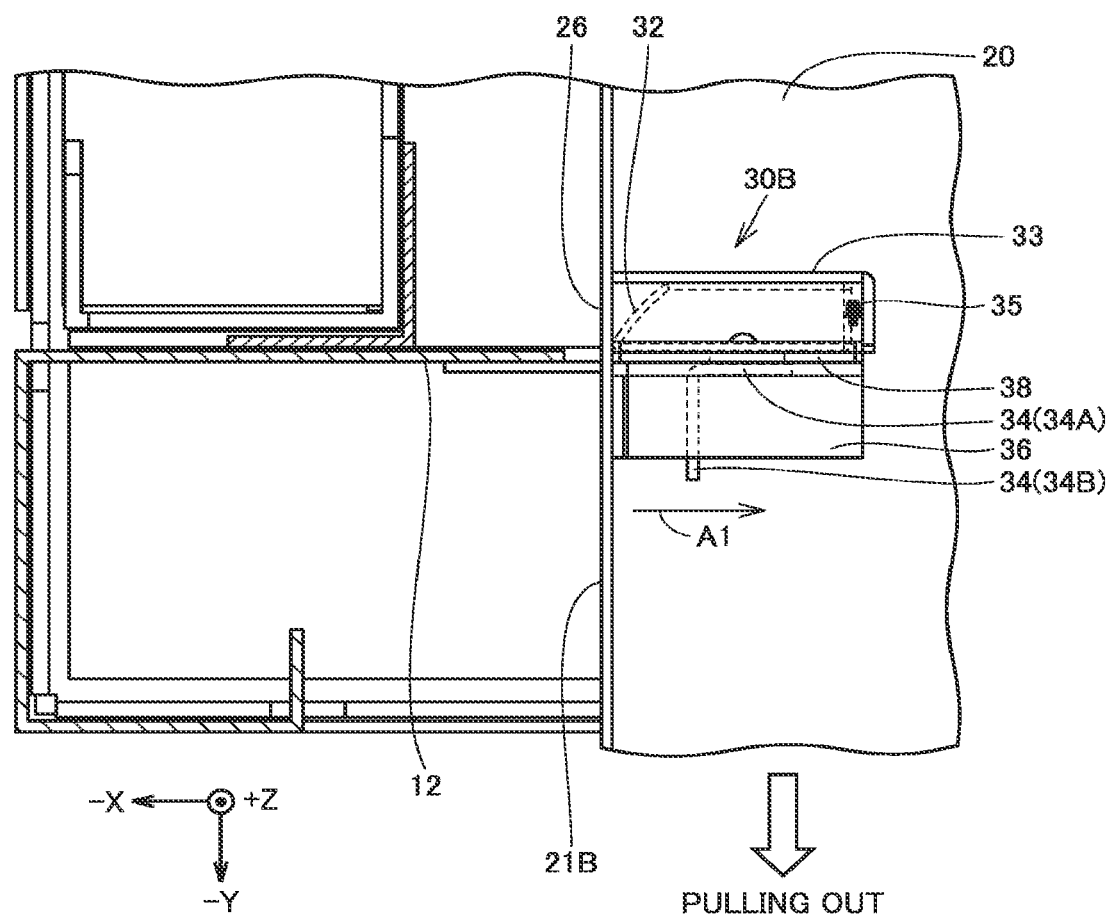
FIG. 6 is a view illustrating the method of pulling out the electric device from the rack.
Figure 7:
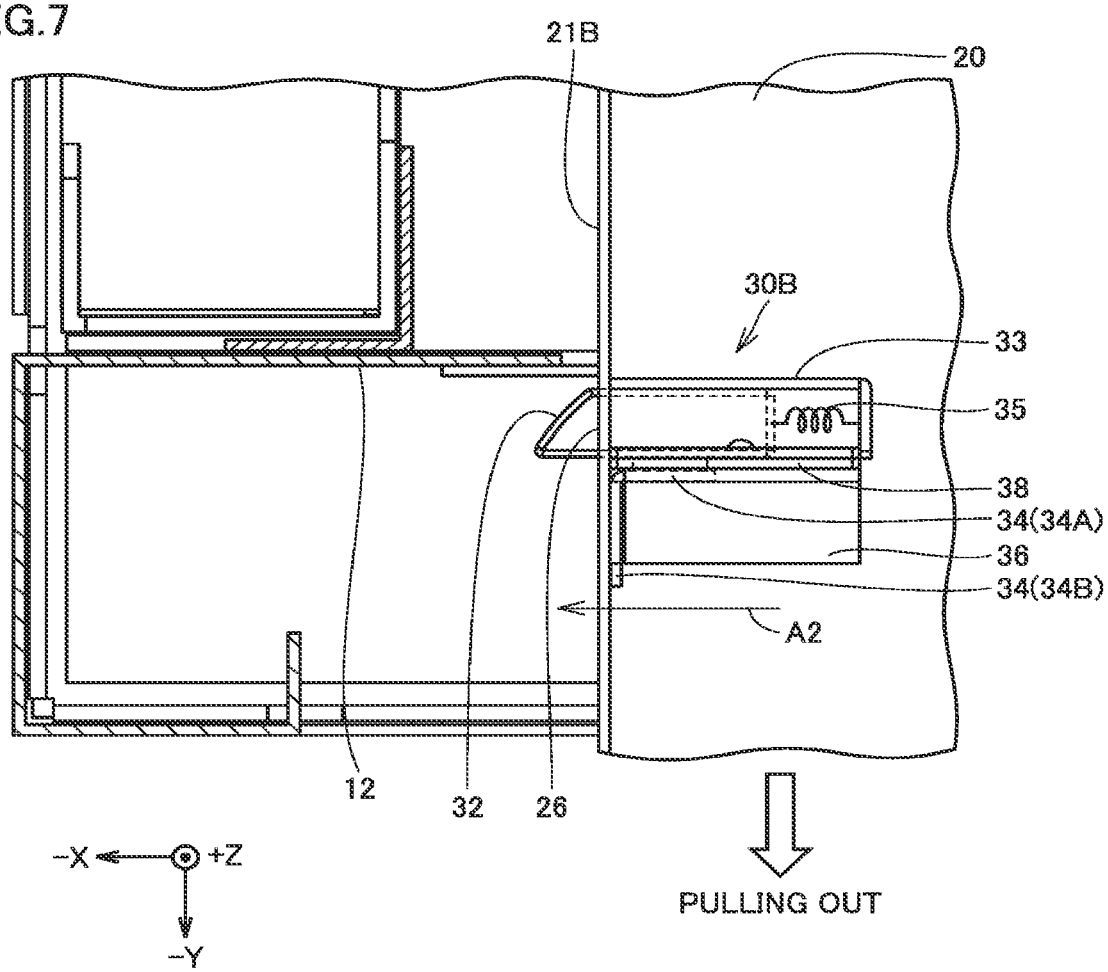
FIG. 7 is a view illustrating the method of pulling out the electric device from the rack.

FIGS. 5 to 7 are views of the vicinity of second column member 12 of rack 110 viewed from an upper surface. FIGS. 5 to 7 show a state where an upper surface of case 21 of electric device 20 shown in FIG. 2 is removed so that the inside of case 21 is visible.

As shown in FIG. 5, second restriction member 30B is attached to the inner surface of second side surface 21B of case 21. Second restriction member 30B has the same configuration as that of first restriction member 30A shown in FIGS. 3 and 4. That is, second restriction member 30B has latch member 32, cover member 33, an elastic member 35, releasing member 34, base member 38, and fixing member 36.

Latch member 32 is arranged in the inside of case 21 to extend in the X-axis direction. Latch member 32 is covered with cover member 33. Elastic member 35 for biasing latch member 32 toward a protruding state is provided inside cover member 33. Elastic member 35 is a coil spring, for example.

The end portion of latch member 32 in the −X direction protrudes from second side surface 21B in the −X direction through opening 26. A surface of the protruding portion of latch member 32 has a curved surface shape that is convex toward the +Y direction.

Releasing member 34 is arranged in front of latch member 32 in the inside of case 21. Base portion 34A of releasing member 34 and latch member 32 are coupled. Bent portion 34B of releasing member 34 extends in the Y-axis direction, and is exposed from opening 26.

Base member 38 is provided between latch member 32 and releasing member 34. Through hole 39 (not shown) extending in the X-axis direction is formed in base member 38. Latch member 32 and base portion 34A of releasing member 34 are coupled inside through hole 39. Base member 38 is fixed to second side surface 21B via fixing member 36.

When electric device 20 is pulled out from the front of rack 110, the operator moves electric device 20 in the −Y direction, as indicated by a white arrow in the drawing. While electric device 20 moves in the −Y direction, the end portion of latch member 32 in the −X direction protruding from second side surface 21B in the −X direction abuts on second column member 12, as shown in FIG. 5. Thereby, movement of electric device 20 in the −Y direction is restricted. Electric device 20 is held with a portion thereof being pulled out from rack 110.

Subsequently, the operator presses bent portion 34B of releasing member 34 exposed from opening 26, toward the inside of case 21, as shown in FIG. 6. Upon receiving this pressing force, bent portion 34B is pushed into the inside of case 21, as indicated by an arrow A1 in the drawing. Thereby, the coupled portion of base portion 34A of releasing member 34 and latch member 32 moves in the +X direction. The end portion of latch member 32 in the −X direction completely enters the inside of case 21. As latch member 32 completely enters the inside of case 21, abutment between the end portion of latch member 32 in the −X direction and second column member 12 is released, and movement of electric device 20 in the −Y direction is permitted.

The operator can simultaneously release abutment between first restriction member 30A and first column member 11 and abutment between second restriction member 30B and second column member 12, by simultaneously pressing bent portion 34B of releasing member 34 in first restriction member 30A and bent portion 34B of releasing member 34 in second restriction member 30B. Thereby, the operator can further move electric device 20 in the −Y direction and completely pull out electric device 20 from rack 110.

When electric device 20 is further moved in the −Y direction from the state in FIG. 6, elastic member 35 biases latch member 32 such that the end portion in the −X direction protrudes from opening 26, as shown in FIG. 7. Upon receiving this biasing force, the coupled portion of base portion 34A of releasing member 34 and latch member 32 moves in the −X direction, as indicated by an arrow A2 in the drawing. As a result, the end portion of latch member 32 in the −X direction protrudes again from second side surface 21B in the −X direction through opening 26.

(Method of Inserting Electric Device)

Next, a method of inserting electric device 20 into rack 110 will be illustrated with reference to FIG. 8.

Figure 8:
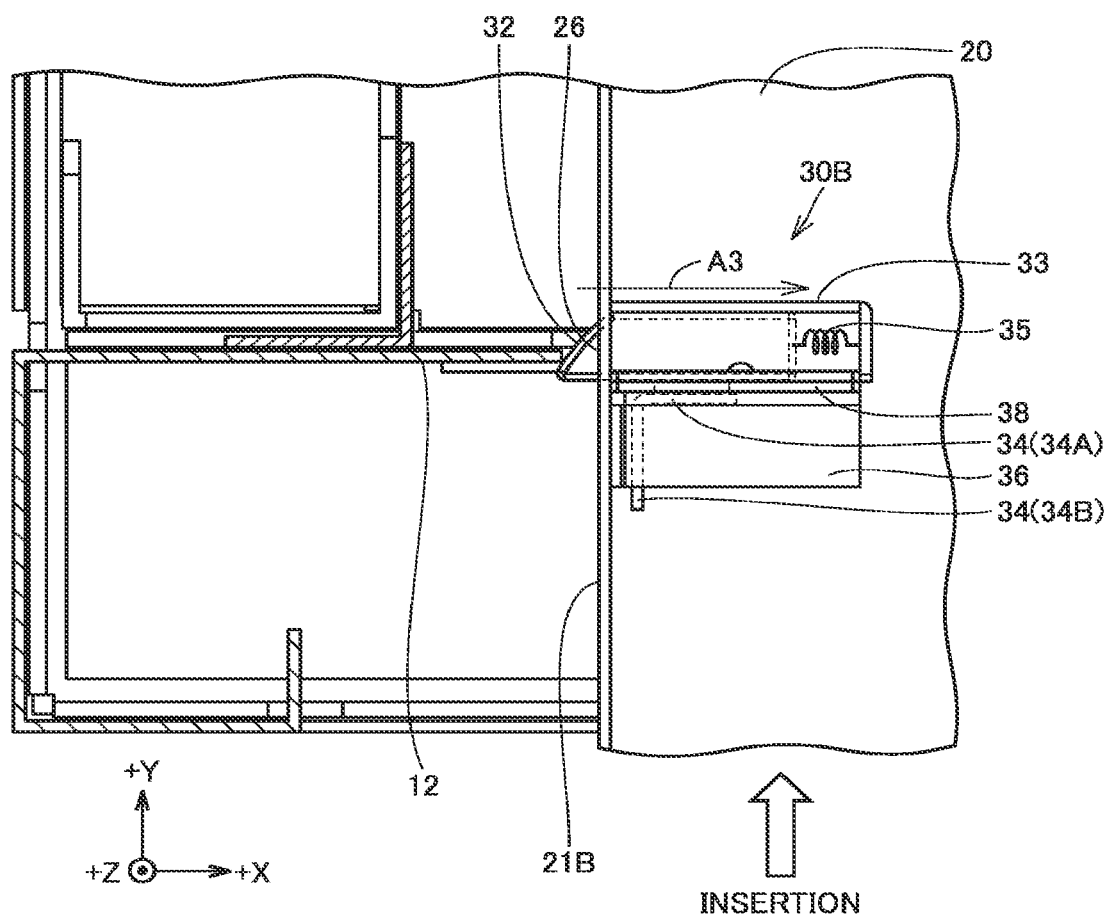
FIG. 8 is a view illustrating a method of inserting the electric device into the rack.

FIG. 8 is a view of the vicinity of second column member 12 of rack 110 viewed from the upper surface. FIG. 8 shows a state where the upper surface of case 21 of electric device 20 shown in FIG. 2 is removed so that the inside of case 21 is visible, as in FIGS. 5 to 7.

In the case of housing electric device 20 in rack 110, a work of inserting electric device 20 into rack 110 from the front of rack 110 is performed according to a procedure opposite to that for the method of pulling out electric device 20 described above.

The operator moves electric device 20 in the +Y direction, as indicated by a white arrow in the drawing. While electric device 20 moves in the +Y direction, the end portion of latch member 32 in the −X direction protruding from second side surface 21B in the −X direction abuts on second column member 12, as shown in FIG. 8.

However, the portion of latch member 32 that abuts on second column member 12 has a curved surface shape that is convex toward the +Y direction. Accordingly, an abutting force provided from second column member 12 to latch member 32 is converted into a force that moves latch member 32 in the +X direction. Upon receiving this force, the coupled portion of base portion 34A of releasing member 34 and latch member 32 moves in the +X direction, and latch member 32 is pushed into the inside of case 21, as indicated by an arrow A3 in the drawing. As latch member 32 is pushed into the inside of case 21, abutment between the end portion of latch member 32 in the −X direction and second column member 12 is released. Therefore, movement of electric device 20 in the +Y direction is permitted.

When electric device 20 is further moved in the +Y direction from the state in FIG. 8, elastic member 35 biases latch member 32 such that the end portion in the −X direction protrudes from opening 26. Upon receiving this biasing force, the coupled portion of base portion 34A of releasing member 34 and latch member 32 moves in the −X direction. As a result, the end portion of latch member 32 in the −X direction protrudes again from second side surface 21B in the −X direction through opening 26.

As described above, according to the present embodiment, since movement to the front of rack 110 is restricted by restriction members 30A and 30B respectively attached to the inner surfaces of side surfaces 21A and 21B of electric device 20 in the width direction, there is no need to attach an engaged member to an outer surface of electric device 20. Hence, electric device 20 can be prevented from having a large size and having a complicated external shape.

Furthermore, in the present embodiment, since there is no need to attach, to rack 110, an engaging member that engages the engaged member, rack 110 can be prevented from having a large size and having a complicated shape. This can avoid increases in the size and weight of entire electric apparatus 100. Further, this can suppress an increase in the cost for processing and assembling rack 110 and electric device 20.

Further, according to the present embodiment, the operator can release abutment between rack 110 and electric device 20 and completely pull out electric device 20 from rack 110, by a simple work of pressing releasing members 34 provided in restriction members 30A and 30B. Furthermore, in the case of housing electric device 20 in rack 110, abutment between restriction members 30A, 30B and rack 110 is automatically released upon insertion of electric device 20 into rack 110. Accordingly, the operator can easily house electric device 20 within rack 110, without a need to perform a work of releasing abutment. As a result, workability in pulling out and inserting electric device 20 from and into rack 110 can be improved.

It should be understood that the embodiment disclosed herein is illustrative and non-restrictive in every respect. The scope of the present disclosure is defined by the scope of the claims, rather than the description above, and is intended to include any modifications within the scope and meaning equivalent to the scope of the claims.

REFERENCE SIGNS LIST 11 to 14: column member; 15A, 15B: guide member; 20: electric device; 21: case; 21A, 21B: side surface; 22A, 22B: fin portion; 24, 29: through hole; 26: opening; 30A, 30B: restriction member; 32: latch member; 33: cover member; 34: releasing member; 34A: base portion; 34B: bent portion; 35: elastic member; 36: fixing member; 100: electric apparatus; 110: rack.

The invention claimed is:

1. An electric apparatus comprising:
a rack having a rectangular parallelepiped shape; and
an electric device housed within the rack to be able to be pulled out and inserted from a front of the rack, wherein
the rack includes
    first and second column members arranged to be spaced from each other in a width direction of the rack, and each extending in a vertical direction,
    third and fourth column members arranged to be spaced from the first and second column members, respectively, in a back direction of the rack, and each extending in the vertical direction,
    a first guide member arranged between the first and third column members, and extending in a front-back direction of the rack, and
    a second guide member arranged between the second and fourth column members to face the first guide member in the width direction, and extending in the front-back direction,
the electric device includes
    a case having a rectangular parallelepiped shape, and having first and second side surfaces in the width direction that are supported by the first and second guide members, respectively,
    a first restriction member attached to an inner surface of the first side surface, for restricting the case from moving in a front direction of the rack, and
    a second restriction member attached to an inner surface of the second side surface to face the first restriction member in the width direction, for restricting the case from moving in the front direction of the rack, and
in a state where the electric device is housed within the rack,
the first restriction member is located between the first and third column members in the front-back direction, and
    the second restriction member is located between the second and fourth column members in the front-back direction.

2. The electric apparatus according to claim 1, wherein the first restriction member includes
    a first latch member configured to abut on the first column member in a state protruding from the case in the width direction through a first opening formed in the first side surface,
    a first elastic member that biases the first latch member toward a protruding state, and
    a first releasing member for moving the first latch member in the width direction to cause the first latch member to completely enter an inside of the case, and
the second restriction member includes
    a second latch member configured to abut on the second column member in a state protruding from the case in the width direction through a second opening formed in the second side surface,
    a second elastic member that biases the second latch member toward a protruding state, and
    a second releasing member for moving the second latch member in the width direction to cause the second latch member to completely enter the inside of the case.

3. The electric apparatus according to claim 2, wherein the first releasing member includes a first base portion coupled to the first latch member, and a first bent portion joined to the first base portion and exposed from the first opening, and moves the first latch member in the width direction in response to a pressing force provided from an outside of the case to the first bent portion through the first opening, and
the second releasing member includes a second base portion coupled to the second latch member, and a second bent portion joined to the second base portion and exposed from the second opening, and moves the second latch member in the width direction in response to a pressing force provided from the outside of the case to the second bent portion through the second opening.

4. The electric apparatus according to claim 3, wherein
the first releasing member is arranged in front of the first latch member in the inside of the case, and
the second releasing member is arranged in front of the second latch member in the inside of the case.

5. The electric apparatus according to claim 2, wherein when the electric device is inserted into the rack from the front of the rack,
the first elastic member receives an abutting force provided from the first column member to the first latch member to cause the first latch member to completely enter the inside of the case, and provides the first latch member with a biasing force that returns the first latch member to the protruding state, and
the second elastic member receives an abutting force provided from the second column member to the second latch member to cause the second latch member to completely enter the inside of the case, and provides the second latch member with a biasing force that returns the second latch member to the protruding state.

6. The electric apparatus according to claim 5, wherein
a surface of a portion of the first latch member protruding from the first side surface has a curved surface shape that is convex toward the back direction of the rack, and
a surface of a portion of the second latch member protruding from the second side surface has a curved surface shape that is convex toward the back direction of the rack.

7. The electric apparatus according to claim 1, wherein the rack includes a plurality of the first guide members arranged to be spaced from each other in the vertical direction, and a plurality of the second guide members arranged to be spaced from each other in the vertical direction, and houses a plurality of the electric devices to be stacked in the vertical direction.

8. An electric device housed within a rack having a rectangular parallelepiped shape to be able to be pulled out and inserted from a front of the rack, wherein
the rack includes
first and second column members arranged to be spaced from each other in a width direction of the rack, and each extending in a vertical direction,
third and fourth column members arranged to be spaced from the first and second column members, respectively, in a back direction of the rack, and each extending in the vertical direction,
a first guide member arranged between the first and third column members, and extending in a front-back direction of the rack, and
a second guide member arranged between the second and fourth column members to face the first guide member in the width direction, and extending in the front-back direction,
the electric device comprises
a case having a rectangular parallelepiped shape, and having first and second side surfaces in the width direction that are supported by the first and second guide members, respectively,
a first restriction member attached to an inner surface of the first side surface, for restricting the case from moving in a front direction of the rack, and
a second restriction member attached to an inner surface of the second side surface to face the first restriction member in the width direction, for restricting the case from moving in the front direction of the rack, and
in a state where the electric device is housed within the rack,
the first restriction member is located between the first and third column members in the front-back direction, and
the second restriction member is located between the second and fourth column members in the front-back direction.

9. The electric apparatus according to claim 2, wherein the rack includes a plurality of the first guide members arranged to be spaced from each other in the vertical direction, and a plurality of the second guide members arranged to be spaced from each other in the vertical direction, and houses a plurality of the electric devices to be stacked in the vertical direction.

10. The electric apparatus according to claim 3, wherein the rack includes a plurality of the first guide members arranged to be spaced from each other in the vertical direction, and a plurality of the second guide members arranged to be spaced from each other in the vertical direction, and houses a plurality of the electric devices to be stacked in the vertical direction.

11. The electric apparatus according to claim 4, wherein the rack includes a plurality of the first guide members arranged to be spaced from each other in the vertical direction, and a plurality of the second guide members arranged to be spaced from each other in the vertical direction, and houses a plurality of the electric devices to be stacked in the vertical direction.

12. The electric apparatus according to claim 5, wherein the rack includes a plurality of the first guide members arranged to be spaced from each other in the vertical direction, and a plurality of the second guide members arranged to be spaced from each other in the vertical direction, and houses a plurality of the electric devices to be stacked in the vertical direction.

13. The electric apparatus according to claim 6, wherein the rack includes a plurality of the first guide members arranged to be spaced from each other in the vertical direction, and a plurality of the second guide members arranged to be spaced from each other in the vertical direction, and houses a plurality of the electric devices to be stacked in the vertical direction.

* * * * *